United States Patent [19]
Tanaka et al.

[11] Patent Number: 5,317,203
[45] Date of Patent: May 31, 1994

[54] SAMPLE-AND-HOLD CIRCUIT

[75] Inventors: Junji Tanaka, Sakurai; Toshio Watanabe, Kita-Katsuragi; Yukihisa Orisaka, Tenri, all of Japan

[73] Assignee: Sharp Kabushiki Kaisha, Osaka, Japan

[21] Appl. No.: 872,160

[22] Filed: Apr. 22, 1992

[30] Foreign Application Priority Data

Apr. 25, 1991 [JP] Japan .................................. 3-095604

[51] Int. Cl.$^5$ .............................................. G11C 27/02
[52] U.S. Cl. .................................... 307/353; 307/359; 328/151
[58] Field of Search ....................... 307/353, 359, 352; 328/151

[56] References Cited

U.S. PATENT DOCUMENTS 5,162,670 11/1992 Itakura et al. ...................... 307/353

FOREIGN PATENT DOCUMENTS

| | | | |
|---|---|---|---|
| 0506344 | 9/1992 | European Pat. Off. ............ | 307/353 |
| 2704483 | 8/1978 | Fed. Rep. of Germany ...... | 307/353 |
| 55-138938 | 4/1979 | Japan . | |
| 619900 | 6/1984 | Japan . | |
| 4205896 | 7/1992 | Japan .................................. | 307/353 |

Primary Examiner—Stuart S. Levy
Assistant Examiner—Toan Tran

[57] ABSTRACT

Disclosed is a sample-and-hold circuit. A plurality of input signals are applied to the capacitors through the corresponding analog switches. The capacitors are charged to the instantaneous voltages of input signals when the corresponding analog switches are conducting. An output circuit comprising a plurality of input circuit legs and an output is provided. Each input circuit leg includes series connected input transistor and switching transistor. Input circuit legs are connected in parallel. A plurality of inputs of the switching trainsistors are supplied with input switching signals to turn on the switching transistors in a systematic chosen sequence. And a plurality of inputs of the input transisntrs are connected to the capacitors to put the voltage across one of the capacitors to the output during the time when the corresponding analog switch is in the hold mode and the corresponding switch transisor is conducting.

11 Claims, 4 Drawing Sheets

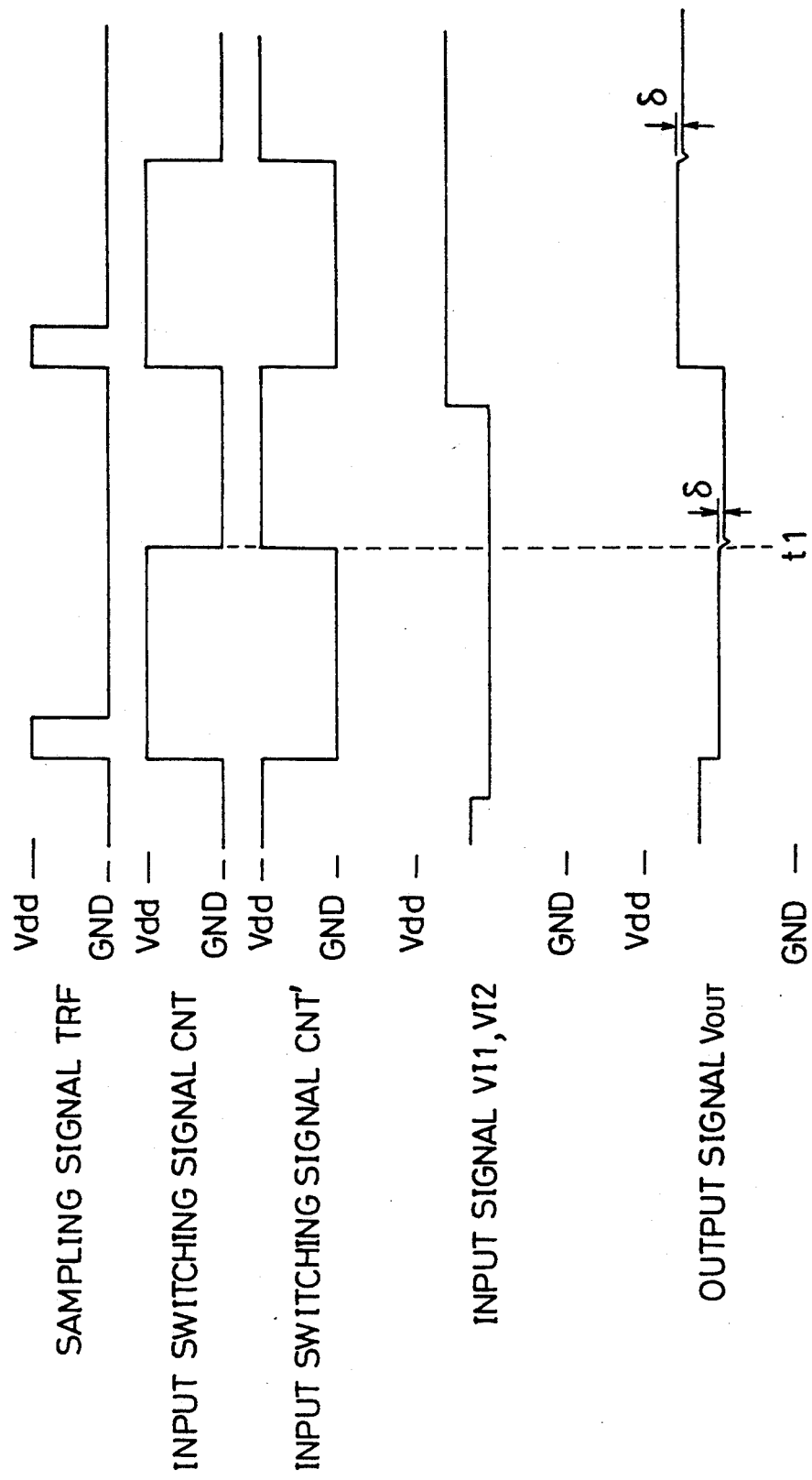

SAMPLE-AND-HOLD CIRCUIT

BACKGROUND OF THE INVENTION

1. Field of the Invention

This invention relates to a sample-and-hold circuit.

2. Description of the Related Art

Sample-and-hold circuits are widely used to store an analog voltage accurately over a time ranging from nanoseconds to minutes.

Sample-and-hold circuits are also used in liquid-crystal display (LCDs). In a LCD television picture display, a given line of video information is broken into the same number of pieces as there are pixels in the horizontal row, and stored in the sample-and-hold stages which all drive their respective drain bus of switching matrix simultaneously, thus creating a line sequential display (vide, for example, D. G. Fink and D. Christiansen, Electronics Engineers' Handbook, Third Edition, McGraw-Hill, New York, 1989, pages 20-102, 20-103).

U.S. patent application Ser. No. 07/868,213, filed on Apr. 14, 1992 of Shinichi URANAKA for Sample-and-hold circuit, claiming the benefit of Japanese Patent Application 082396/91 filed on Apr. 15, 1991, describes a improved sample-and-hold circuit with only one operational amplifier for use in driver of an active matrix addressed LCD.

Referring now to FIG. 3, there is shown in detail a MOS transistor circuit version of the sample-and-hold circuit described in the above mentioned U.S. Patent Application. An input voltage signal VI1 is applied to a capacitor C1 through an analog switch or MOS transistor switch G1, and an input voltage signal VI2 is applied to a capacitor C2 through an analog switch or MOS transistor switch G2. The capacitors C1 and C2 are quickly charged when the switches G1 and G2 are turned on in the sampling mode. The switches G1 and G2 are turned off in the hold mode.

Either one of the capacitors C1 and C2 is selected by input switching signals CNT and CNT', the signal CNT' being the complement of the signal CNT. The value of the voltage across the selected charged capacitor is presented to the output through an output circuit that produces unity voltage gain as an output voltage signal Vout. The output circuit comprises cascaded differential and buffer amplifiers having a feedback connection between them. The differential amplifier, which has two non-inverting and one inverting inputs, comprises n-channel MOS transistors N3, N10, N11, N12, N20, N21 and N22, and p-channel MOS transistors P0 and P1. The buffer amplifier comprises n-channel MOS transistors N4 and N5.

An output circuit comprising cascaded differential and buffer amplifiers having a feedback connection between them is disclosed in U.S. patent application Ser. No. 07/774,830, filed on Oct. 11, 1991 of Junji TANAKA for Analog Signal Extracting Circuit, claiming the benefit of Japanese Patent application 282872/90 filed on Oct. 19, 1990. But the differential amplifier included in it has only one non-inverting input and no switching transistor connected in series with the input transistor in the non-inverting input leg.

Referring now more particularly to FIG. 3, the gates of input transistors N11 and N12, which constitute the non-inverting inputs of the differential amplifier, are respectively connected to the capacitors C1 and C2. The switching transistors N21 and N22 are respectively connected in series with the input transistors N11 and N12 in non-inverting input legs connected in parallel in the differential amplifier. The input switching signals CNT and CNT' are respectively applied to the gates of switching transistors N21 and N22.

The transistors N10 and N20 are connected in series in the inverting input leg of the differential amplifier. Voltage Vdd is supplied to the gate of the transistor N20 as a bias voltage.

The drain of the transistor N3, which acts as a constant-current source, is connected to the sources of the transistors N20, N21 and N22. The source of the transistor N3 is connected to ground. A bias voltage Vb1 is supplied to the gate of the transistor N3.

The drain of transistor P0 is connected to the drain of transistor N10, and the drain of transistor P1 is connected to the drains of transistor N11 and N12. The sources of the transistors P0 and P1 are connected to supply voltage Vdd. The gates of the transistors P0 and P1 are connected together. The gate and the drain of transistor P1 are connected together. The transistors P0 and P1 mutually connected as explained above constitute a well-known current mirror, which acts as a high active drain resistor of the transistor N11 or N12.

The drain of transistor N10, which constitutes the output of the differential amplifier, is connected to the gate of the transistor N4, which constitutes an input of the buffer amplifier. The gate of the transistor N10, which constitutes the inverting input of the differential amplifier, is connected to the source of the transistore N4 which constitutes the output of the buffer amplifier. The direct connection between the gate of the transistor N10 and the source of the transistor N4 provides operational feedback. The source of the transistor N4 in turn is connected to the output terminal of the output circuit where the output voltage signal Vout is taken. The drain of the transistor N4 is connected to supply voltage Vdd.

The drain of the transistor N5, which acts as a constant-current source, is connected to the source of the transistors N4. The source of the transistor N5 is connected to ground. A bias voltage Vb2 is supplied to the gate of the transistor N5.

The operation of the sample-and-hold circuit mentioned above will be explained with reference to FIG. 4 which shows a timing chart.

When the sampling signal TRF applied to the analog switches G1 and G2 is at a high level (Vdd), both of analog switches G1 and G2 are turned on (conducting), which allow the capacitors C1 and C2 to be respectively charged to the instantaneous voltages of the input signals VI1 and VI2. The period of the sampling signal TRF is for example 63.5 microseconds, that is, the line period of the television system. Now for the sake of explanation, input signals VI1 and VI2 are assumed to be the same. However, it should be remarked that both signals are generally different. The transistors N21 and N22 are alternately turned on, because the gates are fed with the input switching signals CNT and CNT', the voltage levels of which are inverted in synchronism with the sampling signal TRF. More specifically, when the input switching signal CNT is at high level (Vdd), transistor N21 is turned on, and the value of the voltage across the charged capacitor C1 is presented to the output of the output circuit comprising differential and buffer amplifiers as the output voltage signal Vout. At this time, transistor N22 remains off, because the input switching signal CNT', which is at low level (ground), is applied to its gate. When the input switching signal CNT' is raised to high level (Vdd) at the instant t1, transistor N22 is turned on, and the value of the voltage on the charged capacitor C2 is presented to the output through the output circuit comprising differential and buffer amplifiers.

The sample-and-hold circuit explained above has the following deficiencies. When the sampling signal TRF is at high level, causing the capacitors C1 and C2 to charge, the voltage at high level is applied to the gate of transistor N21, whereas the voltage at low level (ground) is applied to the gate of transistor N22. However, for the purpose of causing the voltage across the capacitor C2 to be available at the output of the output circuit, the gate voltage of switching transistor N22 makes transition from low level to high level at the instant t1, when the sampling signal TRF is at low level and the switch G2 remains off. The transistor N22 is turned on, and a change in the source voltage of the transistor N12 occurs. This change affects the capacitor C2 through the gate-to-source capacitance of the transistor N12, causing the voltage across the charged capacitor C2 to vary or shift by a small voltage. On the contrary to that, for the purpose of causing the voltage across the capacitor C1 to be available at the output of the output circuit, the gate voltage of switching transistor N21 makes transition from low level to high level at the instant when the sampling signal TRF goes toward high level and the capacitor C1 becomes charged through the switch G1. There is no such variation or shift of the voltage across the capacitor C1 as explained above. Therefore, the output voltage Vout shows a variation δ as illustrated in FIG. 4, even though the same input signals are sampled.

SUMMARY OF THE INVENTION

Accordingly, it is a main object of the present invention to provide a sample-and-hold circuit having a uniform output characteristics and showing no variation of the output voltage signal at the instant when gate voltages of switching transistors make transition.

The object of the invention can achieved by a sample-and-hold circuit comprising: a plurality of capacitors; a plurality of analog switches connected to the capacitors to charge the capacitors to the instantaneous voltages of input signals when the corresponding analog switches are conducting; an output circuit comprising a plurality of input circuit legs, each input circuit leg including series connected input transistor and switching transistor, and being connected in parallel, and an output; a plurality of inputs of the switching transistors supplied with input switching signals to turn on the switching transistors in a systematic chosen sequence; and a plurality of inputs of the input transistors connected to the capacitors to put the voltage across one of the capacitors to the output of the output circuit during the time when the corresponding analog switch is in the hold mode and the corresponding switching transistor is conducting.

BRIEF DESCRIPTION OF THE DRAWINGS

FIG. 4 is a timing chart of signal waveforms for the circuit shown in FIG. 3.

DESCRIPTION OF THE PREFERRED EMBODIMENTS

Figure 1:
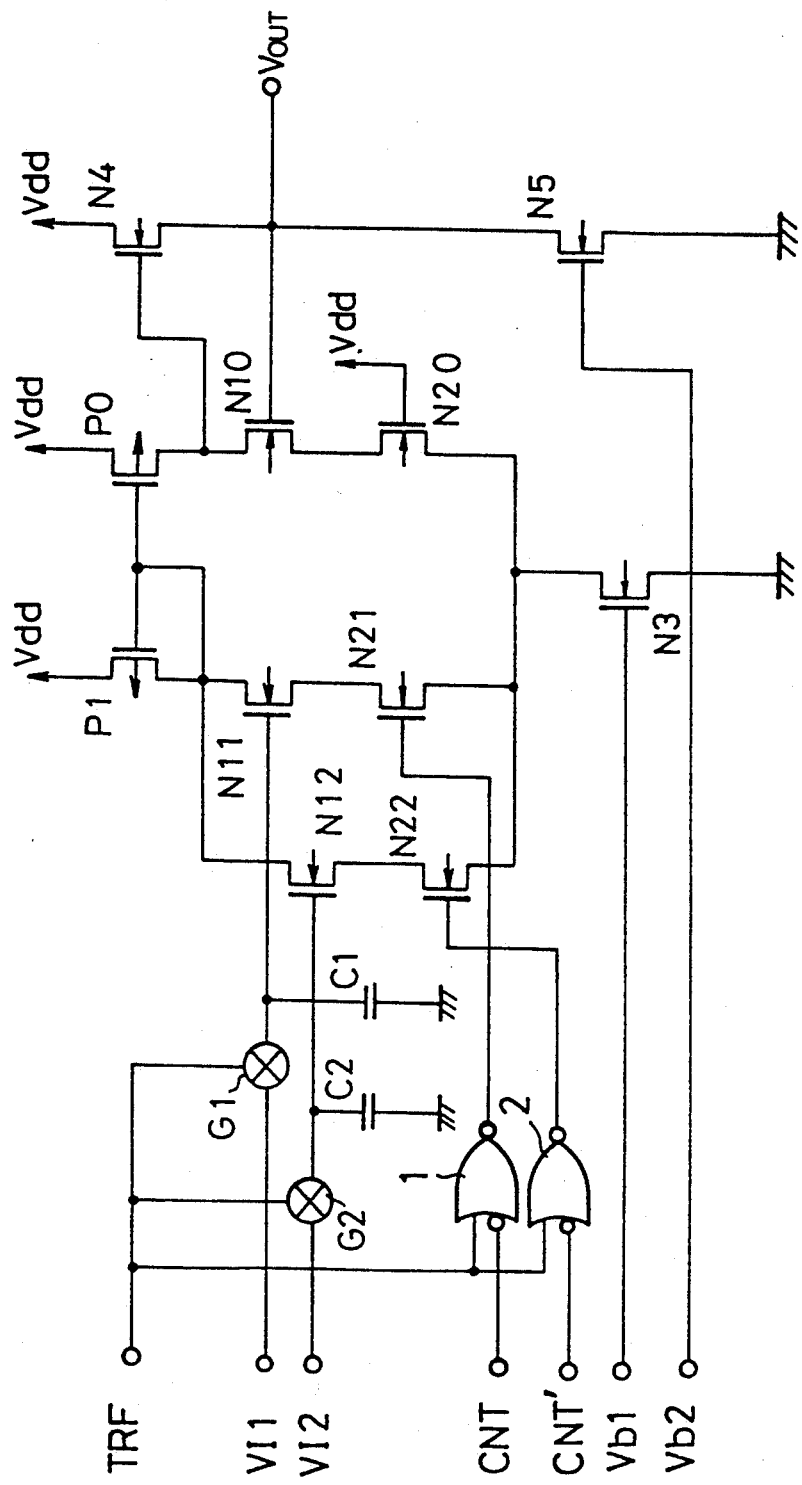
FIG. 1 shows a preferred embodiment of the sample-and-hold circuit of the invention.

Referring now to FIG. 1, there is shown a preferred embodiment of the sample-and-hold circuit of the invention. The reference characters also used in FIG. 3 designate the same things. The sample-and-hold circuit shown in FIG. 1 is different from the circuit shown in FIG. 3 in that the gates of the switching transistors N21 and N22 are respectively connected to the outputs of the NOR circuits 1 and 2. The non-inverting inputs of the NOR circuits 1 and 2 receive the sampling signal TRF. The inverting inputs of the NOR circuits 1 and 2 receive the input switching signals CNT and CNT', respectively.

Figure 3:
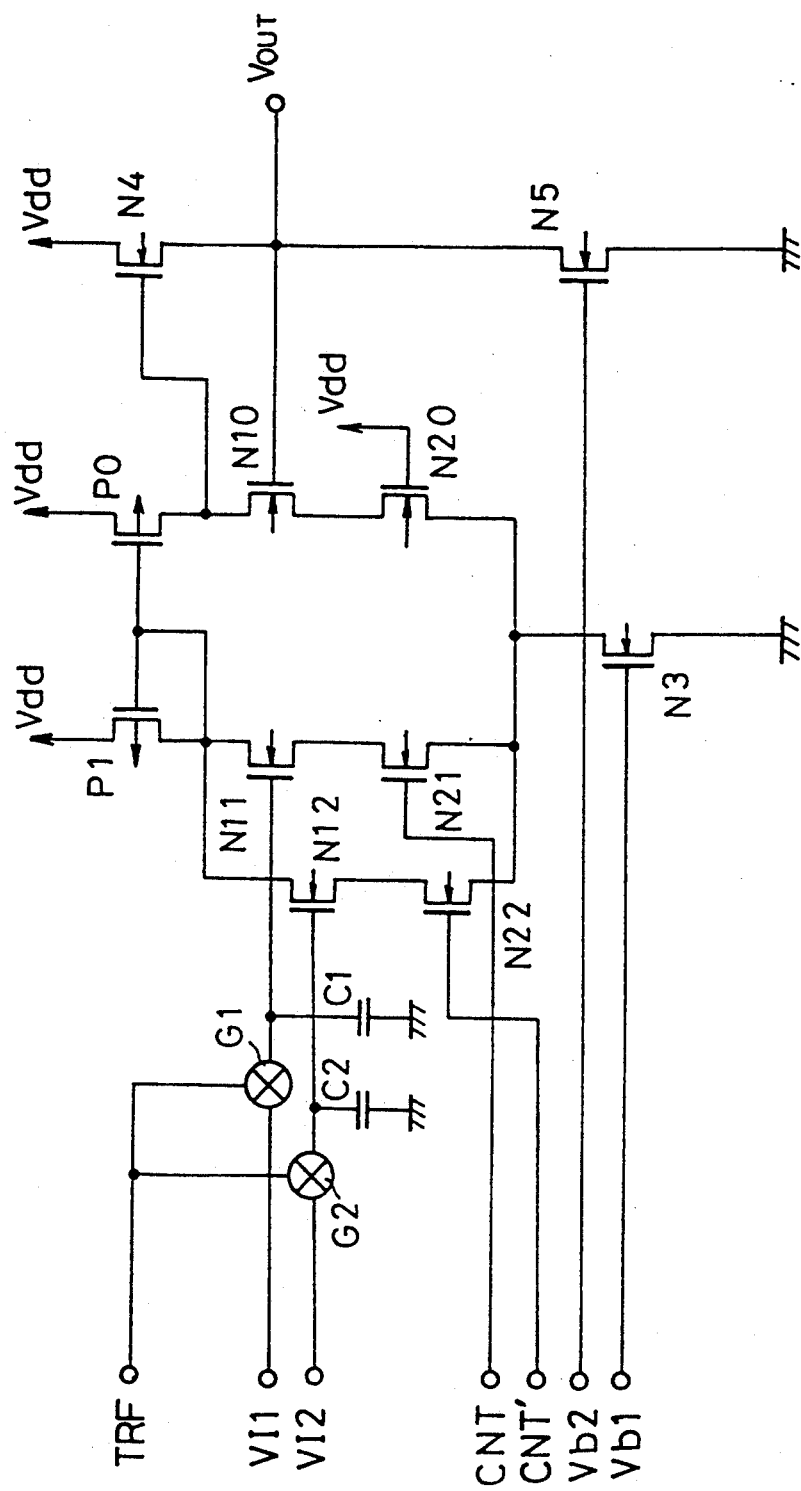
FIG. 3 shows a MOS transistor circuit version of the related art.

The sample-and-hold circuit shown in FIG. 1 has the same configuration as the circuit shown in FIG. 3 except that explained above. That is, the gates of input transistors N11 and N12, which constitute the non-inverting inputs of the differential amplifier, are respectively connected to the capacitors C1 and C2. The switching transistors N21 and N22 are respectively connected in series with the input transistors N11 and N12 in non-inverting input legs connected in parallel in the differential amplifier. The input switching signals CNT and CNT' are respectively applied to the gates of switching transistors N21 and N22. The transistors N10 and N20 are connected in series in the inverting input leg of the differential amplifier. Voltage Vdd is supplied to the gate of the transistor N20 as a bias voltage. The drain of the transistor N3, which acts as a constant-current source, is connected to the sources of the transistors N20, N21 and N22. The source of the transistor N3 is connected to ground. A bias voltage Vb1 is supplied to the gate of the transistor N3. The drain of transistor P0 is connected to the drain of transistor N10. The drain of transistor P1 is connected to the drains of transistor N11 and N12. The sources of the transistors P0 and P1 are connected to supply voltage Vdd. The gates of the transistors P0 and P1 are connected together. The gate and the drain of transistor P1 are connected together. The transistors P0 and P1 mutually connected as explained above constitute a well-known current mirror, which acts as a high active drain resistor of the transistor N11 or N12. The drain of transistor N10, which constitutes the output of the differential amplifier, is connected to the gate of the transistor N4, which constitutes an input of the buffer amplifier. The gate of the transistor N10, which constitutes the inverting input of the differential amplifier, is connected to the source of the transistors N4 which constitutes the output of the buffer amplifier. The direct connection between the gate of the transistor N10 and the source of the transistor N4 provides operational feedback. The source of the transistor N4 in turn is connected to the output terminal of the output circuit where the output voltage signal Vout is taken. The drain of the transistor N4 is connected to supply voltage Vdd. The drain of the transistor N5, which acts as a constant-current source, is connected to the source of the transistors N4. The source of the transistor N5 is connected to ground. A bias voltage Vb2 is supplied to the gate of the transistor N3.

Figure 2:
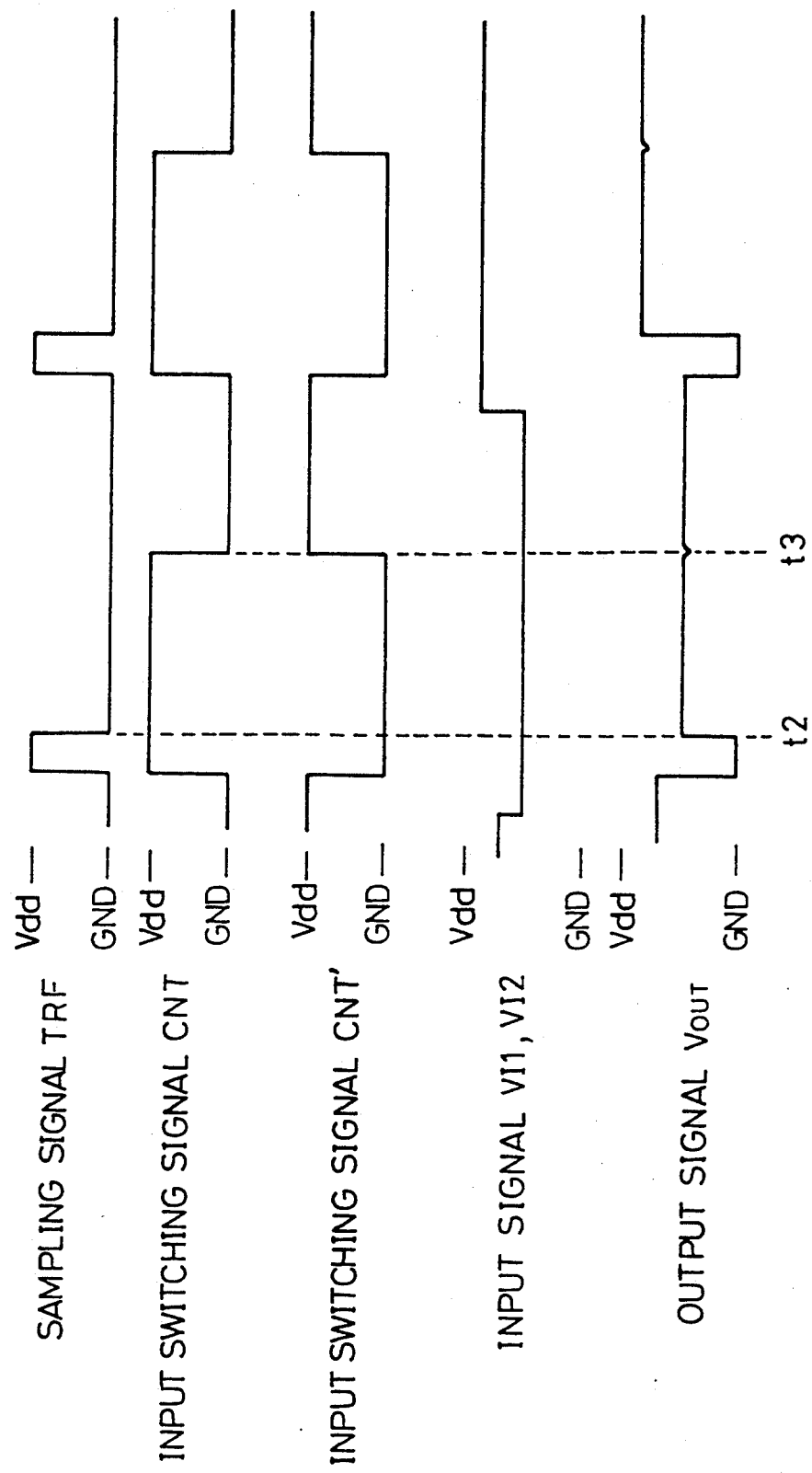
FIG. 2 is a timing chart of signal waveforms for the circuit shown in FIG. 1.

Now the sample-and-hold circuit having the configuration mentioned above will be explained in reference to the timing chart shown in FIG. 2. When the sampling signal TRF at high level is applied to the analog switches G1 and G2, both of them become turned on. The input signals VI1 and V12 charges the capacitors C1 and C2 through the switches, respectively. During this time, the outputs of the NOR circuits 1 and 2 are all at low level, because the sampling signal TRF is input to the non-inverting inputs. Therefore, both of the switching transistors N21 and N22 are turned off. When the sampling signal TRF goes toward low level at the instant t2, the signals CNT and CNT' is still at high and low levels, respectively. The output of the NOR circuit 1 goes toward high level, but the output of the NOR circuit 2 remains at low level. Therefore, the transistor N21 is turned on, but the transistor N22 remains cut off, putting the voltage across the capacitor C1 to the output through the output circuit comprising the differential and buffer amplifiers. Then, at the instant t3, the signals CNT and CNT' go toward low and high levels, respectively. The outputs of the NOR circuits 1 and 2 go toward low and high levels, respectively. Therefore, the transistor N21 is turned off and the transistor N22 is turned on, putting the voltage across the capacitor C2 to the output through the output circuit.

As explained above, the sample-and-hold circuit according to the embodiment of the present invention, both of gate voltages of switching transistors N21 and N22 are kept to ground potential during the sampling mode when the capacitors C1 and C2 are charged. And the voltage at high level is applied to the gates of the transistors N21 or N22, when the voltage across the capacitor C1 or C2 is to be put to the output. The voltages across the charged capacitors C1 and C2 are varied or shifted equally when the gate voltages of the corresponding switching transistors make transition. Therefore, the sample-and-hold circuit provides a balanced or uniform output voltage Vout, showing no variation as experienced in the circuit of the prior art. The uniform shift of the voltage across capacitors C1 and C2 is easy to correct and offers no problem, especially in the LCD television picture display, for example.

The invention has been described in detail with particular reference to the embodiment, but it should be understood that variations and modifications of the invention can be made within the spirits and scope of the invention. For example, while NOR circuits 1 and 2 are used as the means of cutting off the transistors N21 and N22 during the time when analog switches G1 and G2 become on, different logic circuits may be used. Or, different input switching signals may be used in order to realize a sample-and-hold circuit that performs the same operation as in the embodiment explained above. Moreover, while the number of the inputs is two in the embodiment explained above, the circuit version that handles many inputs can be realized by adding analog switches and capacitors connected together and input circuit legs, each of the input circuit legs comprising series connected input transistor and switching transistor, connected in parallel with other input circuit legs. And the transistors that constitute the input transistors, switching transistors and buffer may be p-channel MOS transistors, while the transistors that constitute the current mirror may be n-channel MOS transistors.

What is claimed is:

1. A sample-and-hold circuit, comprising:
    a plurality of inputs for receiving input signals with instantaneous voltages;
    a plurality of capacitors;
    a plurality of analog switches connected respectively between the inputs for receiving input signals and the capacitors to charge the capacitors to the instantaneous voltages of input signals when the corresponding analog switches are conducting by a sampling signal;
    an output circuit comprising a differential amplifier and a buffer amplifier connected in cascade;
    the differential amplifier comprising a plurality of input circuit legs connected in parallel, each input circuit leg including an input transistor and a switching transistor connected in series;
    an input of the input transistor in each input circuit leg being a non-inverting input of the differential amplifier;
    a feedback connection provided between an inverting input of the differential amplifier and an output of the buffer amplifier constituting an output of the sample-and-hold circuit;
    a plurality of inputs of the switching transistors respectively connected to a plurality of logic circuits to turn on the switching transistors in a systematic chosen sequence in the hold mode of the analog switches, wherein each of the logic circuits is supplied with an input switching signal and the sampling signal; and
    the inputs of the input transistors connected to the capacitors to put the voltage across one of the capacitors to the output of the sample-and-hold circuit when the corresponding switching transistor is turned on.

2. A sample-and-hold circuit as in claim 1, wherein the transistors are MOS transistors.

3. A sample-and-hold circuit as in claim 2, wherein the number of input transistors is two.

4. A sample-and-hold circuit as in claim 2 wherein the buffer amplifier is a source follower.

5. A sample-and-hold circuit as in claim 4, wherein the differential amplifier comprises a current mirror acting as high active drain resistors.

6. A sample-and-hold circuit comprising:
    a plurality of inputs for receiving input signals with instantaneous voltages;
    a plurality of capacitors;
    a plurality of analog switches connected respectively between the inputs for receiving input signals and the capacitors to charge the capacitors to the instantaneous voltages of the input signals when the corresponding analog switches are conducting by a sampling signal;
    an output circuit comprising a plurality of input circuit legs connected in parallel, each input circuit leg including an input transistor and a switching transistor connected in series;
    a plurality of inputs of the switching transistors supplied with input switching signals to turn on the switching transistors in a systematic chosen sequences;
    a plurality of inputs of the input transistors connected to the capacitors to put the voltage across one of the capacitors to the output of the output circuit; and
    a plurality of NOR circuits, the outputs of NOR circuits being connected respectively to the inputs of the switching transistors and the inputs of NOR circuits being connected respectively to the sampling signal and inverted input switching signals.

7. A sample-and-hold circuit as in claim 6, wherein the transistors are MOS transistors.

8. A sample-and-hold circuit as in claim 7, wherein the output circuit comprises a differential amplifier and a buffer amplifier connected in cascade, an inverting input of the differential amplifier and an output of the buffer amplifier are connected to form a feedback connection and the inputs of input transistors of input circuit legs are non-inverting inputs of the differential amplifier.

9. The sample-and-hold circuit as in claim 8, wherein the number of the input transistors is two.

10. A sample-and-hold circuit as in claim 8, wherein the buffer amplifier is a source follower.

11. A sample-and-hold circuit as in claim 10, wherein the differential amplifiers comprises a current mirror acting as high active drain resistors.

* * * * *